United States Patent [19]

Goutzoulis

[11] Patent Number: 4,683,420
[45] Date of Patent: Jul. 28, 1987

[54] ACOUSTO-OPTIC SYSTEM FOR TESTING HIGH SPEED CIRCUITS

[75] Inventor: Anastasios P. Goutzoulis, Forest Hills Boro, Pa.

[73] Assignee: Westinghouse Electric Corp., Pittsburgh, Pa.

[21] Appl. No.: 753,506

[22] Filed: Jul. 10, 1985

[51] Int. Cl.[4] .................... G01R 31/26; G01R 17/02; G01R 19/10

[52] U.S. Cl. .................. 324/73 R; 324/96; 356/394; 371/15; 371/16; 371/25

[58] Field of Search .................. 324/73 R, 96, 158 R; 371/15, 25; 364/550, 480, 837, 821, 822; 356/394; 350/358, 355, 356, 393, 388, 3.64, 3.67, 3.68; 382/1, 65; 250/568, 216, 229

[56] References Cited

U.S. PATENT DOCUMENTS

| | | | |
|---|---|---|---|
| 3,614,451 | 10/1971 | Gunn | 350/356 X |
| 3,916,306 | 10/1975 | Patti | 371/25 X |
| 4,114,116 | 9/1978 | Reeder | 364/821 X |
| 4,124,280 | 11/1978 | Berg | 364/822 X |
| 4,218,142 | 8/1980 | Kryger et al. | 356/394 |
| 4,242,635 | 12/1980 | Burns | 324/158 R |
| 4,365,310 | 12/1982 | Green | 350/358 X |
| 4,403,834 | 9/1983 | Kley | 350/371 |
| 4,408,884 | 10/1983 | Kleinknecht et al. | 356/355 |
| 4,504,921 | 3/1985 | Nasuta et al. | 371/15 X |
| 4,603,293 | 7/1986 | Mourou et al. | 324/77 K X |

OTHER PUBLICATIONS

SPIE vol. 218, Devices and Systems for Optical Signal Processing (1980), Verber, C., et al., "Integrated Optical Circuit for Performing Vector Subtraction", pp. 23-26.

Primary Examiner—Reinhard J. Eisenzopf
Assistant Examiner—Stephen M. Baker
Attorney, Agent, or Firm—R. P. Lenart

[57] ABSTRACT

An optical system for testing the operation of very high speed logic devices. Output signals from the device being tested are loaded into a spatial light modulator while running at normal clocking frequencies. After being fully loaded, a laser light source is pulsed to send a short light signal through the spatial light modulator and onto a light detector array. The spatially modulated light, which is imaged upon the detector array, corresponds to the bit stream of data from the output of the device under test. According to one embodiment, the modulated signal is compared to stored binary values by conventional logic circuits. According to another embodiment, a second spatial light modulator is used to form a coinciding image on the same detector array. This second image corresponds to the complement of the correct output signal. Optically adding the two images on the detector array and producing the electrical equivalents of the light signals to detect one of three possible intensity values gives information about the presence, location, and nature of errors in the output signal of the device under test.

20 Claims, 9 Drawing Figures

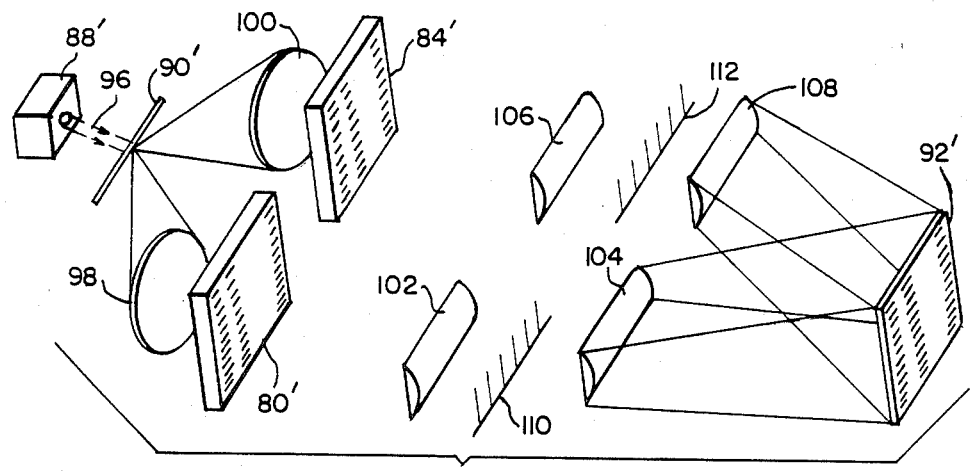
FIG. 6.
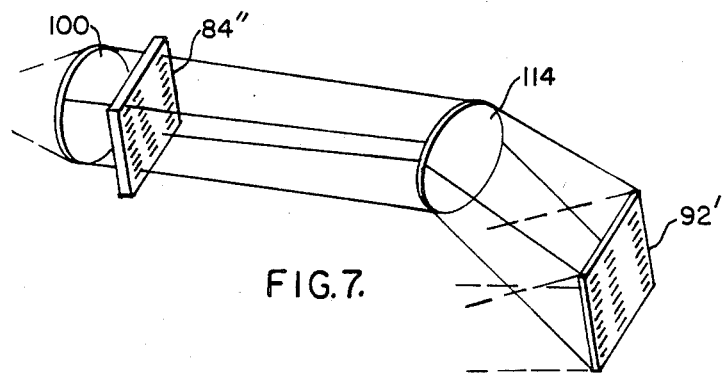
FIG. 7.
FIG. 8.
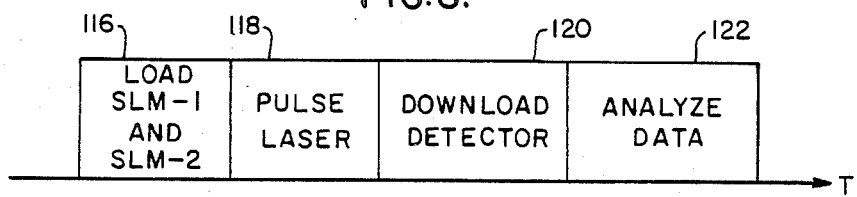
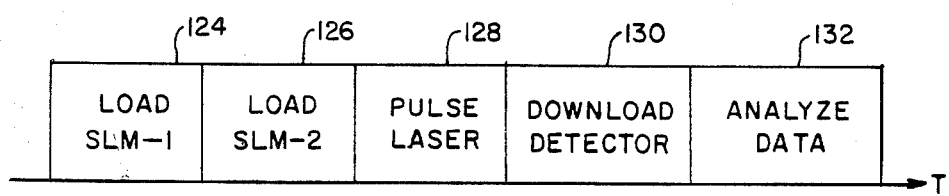
FIG. 9.

ACOUSTO-OPTIC SYSTEM FOR TESTING HIGH SPEED CIRCUITS

BACKGROUND OF THE INVENTION

This invention relates, in general, to high speed digital testing systems and, more specifically, to the testing of high speed very large scale integrated circuit chips.

The testing of very high speed digital systems, such as VHSIC systems and other high speed very large scale integrated circuit (VLSIC) chips, can significantly affect the total manufacturing time of the device or circuit. Since these circuits usually have a large number of input and output lines or parallel bit positions, a particular output signal or bit pattern is produced for a specific input signal or bit pattern. By testing all of the possible output signal combinations, it can be determined whether the device under test is operating properly. If some of the output combinations fail the test, a determination can be made whether to declare the device defective or relegate it to a less severe service, a lower operating speed, or other operating conditions which do not require every output to be correct at the normal operating speed.

The test requirements can be met, in principle, by the use of conventional digital electronic technology. However, problems with such technology arise because of the need for large capacity, high speed memory and shift registers (~100 MHz), the degree of achievable parallelism, the expandability to very high clock frequencies ($\geq$500 MHz), and cost.

Present day very large scale integrated circuit chips often have up to 32 parallel input lines and 32 parallel outputs. To test such chips for every conceivable combination of inputs and outputs is an inordinate task and requires a considerable amount of time. Therefore, it is practical in many situations to test the circuit with a predetermined pattern or set of input signals which, in most cases, adequately determines whether the chip is satisfactory or is defective. It is also desirable to test the chip at its normal speed of operation, or clocking rate, to obtain a true indication of the performance of the chip under actual operating conditions. In addition, it is advantageous not only to detect the presence of errors in the output signal, but to indicate the location of the error and the state of the incorrect logic level detected.

Therefore, it is desirable, and it is an object of this invention, to provide a system and method for quickly and accurately testing high speed logic systems, and for giving location and state information about any detected errors.

SUMMARY OF THE INVENTION

There is disclosed herein a new and useful system and method for testing very high speed integrated circuit chips and associated logic systems. The testing system uses at least one acousto-optic spatial light modulator and a light detector array. In one embodiment of the invention, the outputs from the device under test are used to load data onto the spatial light modulator. After being loaded, a light source is pulsed on and the light passing through the spatial light modulator is imaged onto the detector array. After downloading the data from the detector array, it is compared with the expected or correct output values stored in a memory array. Incorrect values and their location and state are indicated by the comparison electronics.

In another embodiment of the invention, two spatial light modulators are used with one pulsed light source and one detector array. One of the spatial light modulators is loaded with the output data from the device under test. The other spatial light modulator is loaded with data corresponding to the complement of the expected of correct output signal. When both spatial light modulators are properly loaded, the light source is pulsed on. Light from both spatial light modulators is imaged onto the same detector array and analyzed to determine variations in light intensities corresponding to any errors in the output signal from the device under test. Because of the unique characteristics of the complemented signal and the additive characteristics of the detector array, three different light intensities may be present depending upon the characteristics of the output signal. A middle intensity level is present when the output signal is correct. The intensity level is greater than the middle intensity level when the output signal is incorrect by having a high logic level when it should be a low logic level. An intensity measured or detected having an intensity which is lower than the middle or correct intensity level is characteristic of an incorrect output signal caused by the actual logic level being low instead of high.

In another embodiment of the invention, a magneto-optic cell is used in place of an acousto-optic cell when system timing constraints permit. When using a magneto-optic cell, the associated lenses and filters are replaced by an analyzer which passes light according to the polarity of the received light.

BRIEF DESCRIPTION OF THE DRAWINGS

Further advantages and uses of this invention will become more apparent when considered in view of the following detailed description and drawings, in which:

FIG. 6 is a pictorial view of the embodiment shown in FIG. 5;

FIG. 7 is a pictorial view illustrating a modification to the embodiment shown in FIG. 6;

FIG. 8 is a timing diagram for the operation of the embodiment shown in FIG. 6; and FIG. 9 is a timing diagram for the operation of the embodiment shown in FIG. 7.

DESCRIPTION OF THE PREFERRED EMBODIMENTS

Figure 1:
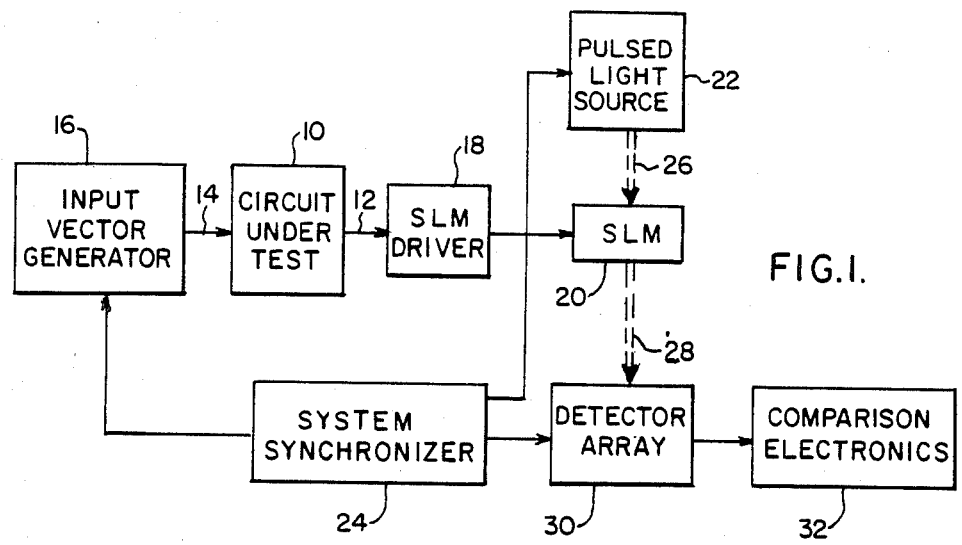
FIG. 1 is a block diagram of the invention constructed according to one specific embodiment.

Throughout the following description, similar reference characters refer to similar elements or members in all of the figures of the drawings.

Referring to the drawings, and to FIG. 1 in particular, there is shown a block diagram of one embodiment of the invention. The circuit under test 10 may be any electronic logic device which has an output signal 12 which is predictable from the input signal 14. For example, the circuit under test 10 may be a very large scale integrated circuit (VLSIC) having a 32-bit parallel output signal with time varying bit patterns corresponding to a 32-bit parallel input signal. The 32-bit parallel input signal is known as an input vector and is provided by the input vector generator 16. Vector sets are used to test the circuit 10 in enough different patterns to determine whether the circuit 10 is good or defective, or should be downgraded to a less severe service. A set of input vectors is usually produced in real time by complex dedicated high speed logic circuits.

The output signal from the circuit 10 is applied to the spatial light modulator driver 18 which drives the spatial light modulator (SLM) 20. The spatial light modulator may be an acousto-optic cell having a suitable number of independent channels on which the output data may be loaded. For a 32-bit output signal, the spatial light modulator 20 would preferably have 32 channels. The information loaded onto the SLM 20 consists of the 1's and 0's of the logic output channels. In some applications in order to distinguish between similar logic levels, logical 0's may be inserted in the loaded signal after every bit.

A pulsed light source 22, such as a pulsed laser, is controlled by the system synchronizer 24 and is turned on to emit the light 26 when the spatial light modulator 20 has been loaded with a bit stream of data from the circuit under test 10. The light passing through the spatial light modulator 20 is modulated spatially and is imaged onto the detector array 30. The detector array 30 includes enough pixels or individual detecting cells to measure the light intensity of each signal bit loaded onto the spatial light modulator 20. Once the detector array 30 acquires the light intensity data, it is downloaded to the comparison electronics for determining whether the output signal is correct for the particular input vector. Since the ouput signal has been saved by the high speed optical process, conventional and slower speed electronic circuitry can be used in the comparison portion of this embodiment.

Figure 2:
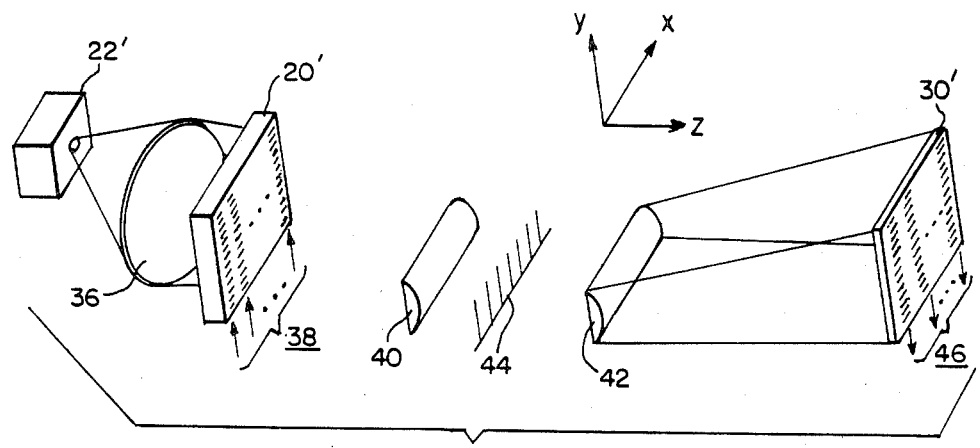
FIG. 2 is a pictorial view of the embodiment shown in FIG. 1.

FIG. 2 is a pictorial view of the embodiment shown in FIG. 1. The pulsed laser 22', upon command, emits a coherent light which is collimated onto the spatial light modulator 20' by the lens 36. The spatial light modulator 20' is an acoustic-optic cell having a plurality of channels which are loaded with the outputs from the circuit under test along the y-dimension, as indicated by arrows 38. The light imaged on the spatial light modulator 20' is spatially modulated and passes through the lenses 40 and 42, and through the filter 44, before reaching the detector array 30'. The lenses 40 and 42 and the filter 44 function to filter out the non-modulated portion of the light signal traveling through the spatial light modulator 20'. In an actual system, the lenses 40 and 42 would be physically large enough to diffract all of the modulated light rays coming from the SLM 20'.

The detector array 30' is a two-dimensional array having a plurality of individual channels, with each channel having a resolution sufficient to provide a number of pixels equal to the number of output bits loaded onto the spatial light modulator 20'. Data obtained by the detector array 30' is downloaded, for each channel, to appropriate comparison electronics, as indicated by arrows 46.

Figure 3:
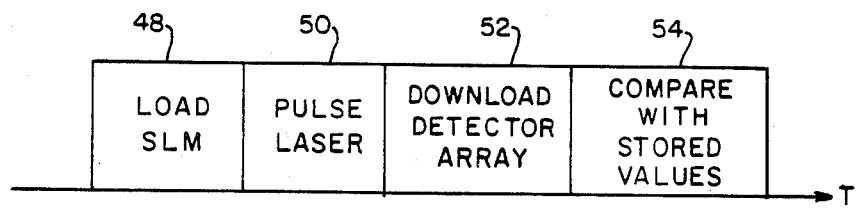
FIG. 3 is a timing diagram for the operation of the embodiment shown in FIGS. 1 and 2.

Operation of the systems shown in FIG. 1 and 2 is illustrated by the timing diagram shown in FIG. 3. The input vectors are applied to the circuit under test and the output signals from the circuit under test are loaded onto the spatial light modulator, as shown by block 48 in FIG. 3. Present day spatial light modulators are capable of receiving the output data at a frequency rate compatible with the clocking rate of very high speed intergrated circuits. The number of bits of data for each parallel channel which can be loaded onto the spatial light modulator is dependent upon the number of pixels or cells of the modulator. For example, if the spatial light modulator 20', as shown in FIG. 2, contains 32 separate channels, each having a pixel resolution of 256, 256×32 bits of information from the output signal are loaded onto the spatial light modulator, disregarding any bits needed for spacing zeros between signal bits. Once completely loaded, the input vectors are stopped and the laser is pulsed on to illuminate the spatial light modulator and to provide spatially modulated light to the detector array. After the laser is pulsed on, as shown by block 50 in FIG. 3, the data on the detector array is downloaded, as shown by block 52. The downloaded data is compared by ordinary digital electronics, as shown in block 54, to determine whether the output signal contained any errors, and for determining the location and state of any errors detected. By using this arrangement of the invention, high speed output signals from the circuit under test can be applied, at normal operating speeds, to a device which, in cooperation with other system devices, optically stores the bit patterns for use by ordinary and slower operating digital electronic circuits.

Figure 4:
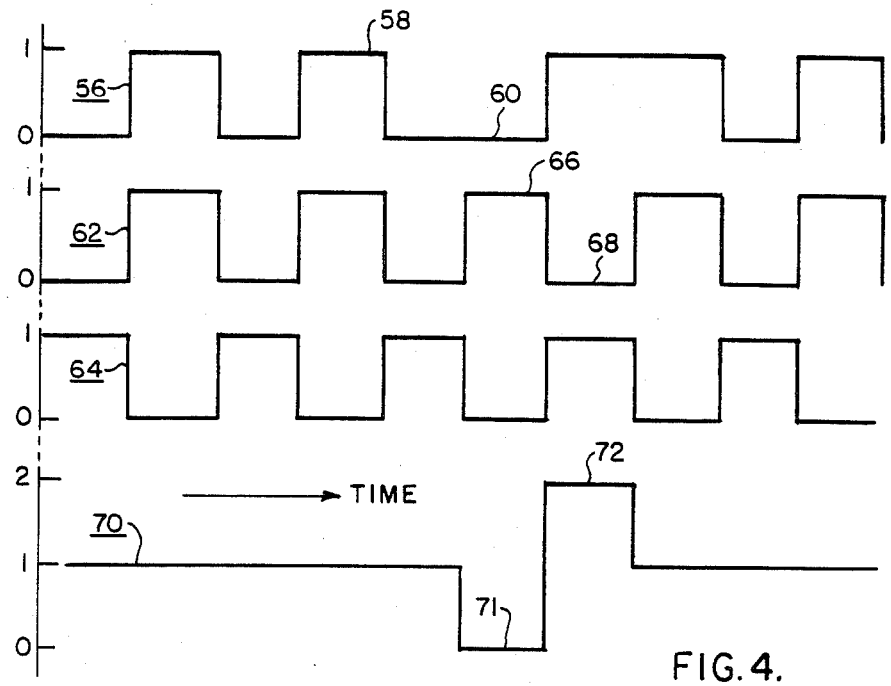
FIG. 4 is a waveform chart used in describing the operation of the embodiment shown in FIG. 5.
Figure 5:
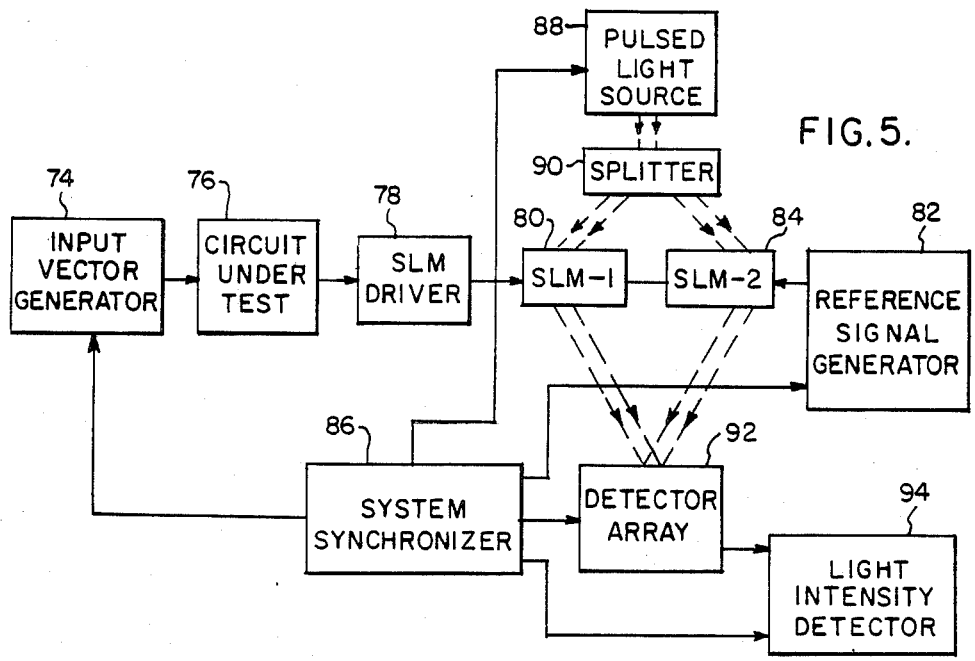
FIG. 5 is a block diagram of the invention constructed according to another specific embodiment of the invention.

FIG. 4 shows various waveforms which exist in the embodiments of the invention illustrated in FIGS. 5 and 6 Waveform 56 represents the digital logic values of the output signal form the circuit under test. As can be seen from waveform 56, the logic value of the output varies according to time and is dependent upon the input vector. Most devices under test would have several such waveforms outputted in parallel, such as 32 such waveforms with a 32-bit parallel output device. Waveform 56 illustrates that, during a portion of the output time, the signal is at a high logic level as shown by segment 58, and at a low logic level as shown by segment 60. Waveform 62 is representative of the true waveform, or correct waveform, which is expected from the device under test. Similarly, waveform 64 is the complement of the waveform 62, whereupon a high logic level of waveform 62 is represented by a low logic level of waveform 64.

It can be seen from FIG. 4 that the actual output waveform 56 is not consistent with the expected or correct waveform 62. By the additive process used by the embodiment shown in FIGS. 5 and 6 , the complement waveform 64 is added optically with the actual output waveform 56 to provide the resulting waveform 70. Since the logic values were converted into light intensities, the additive process can result in a light intensity of twice that represented by a single high logic level. For example, segment 72 corresponds to a light intensity which is two times the light intensity of a single high logic level intensity from the output waveform 56.

By analysis of the waveforms of FIG. 4, it can be seen that waveform 70 has a constant intensity level corresponding to a level of one whenever the output waveform 56 is the same as the expected or corrected waveform 62. In other words, adding waveforms 56 and 64 together produces, when the output signal is correct, a light intensity level of one. Whenever the output signal is not correct, light intensity values for the waveform 70 become either zero or two, as shown by segments 71 and 72, respectively. Not only do the segments 71 and 72 of waveform 70 indicate that the output waveform is incorrect, the level of segments indicate the location and state of the incorrect signal output.

FIG. 5 is a block diagram of an embodiment of the invention which uses the additive method of signal comparison shown graphically in FIG. 4. As shown in FIG. 5, the input vectors are generated by the input vector generator 74 and applied to the circuit under test 76. The output signals from the circuit under test 76 are applied to the spatial light modulator driver 78 which drives to the first spatial light modulator 80. Thus spatial light modulator 80 contains the digital data from the outputs of the circuit under test, corresponding to the output waveform 56 shown in FIG. 4.

A reference signal generator 82 provides the complement of the expected or correct output signal, corresponding to waveform 64 of FIG. 4. This expected signal is applied or loaded into the second spatial light modulator 84. The reference signal generator 82 can be conventional digital circuitry capable of operating sufficiently fast enough to load the spatial light modulator 84, or a "perfect chip" which is similar to the circuit under test and known to have correct outputs.

After both spatial light modulators 80 and 84 are loaded with their respective data, the pulsed light source 88 is turned on by the system synchronizer 86. Light emitting from the light source 88 is divided by the splitter 90 and imaged onto the spatial light modulators 80 and 84 by a suitable lens system. After passing through the spatial light modulators 80 and 84, the spatially modulated light is imaged onto the detector array 92 which is downloaded so that the light intensity detector 94 can determine the amount of light detected by the array 92, corresponding to waveform 70 of FIG. 4. Therefore, the light intensity detector 94 looks for a light intensity different than that provided by a correct output signal combined with the complement of the correct output signal. The inherent additive properties of the detector array 92 makes errors in the output signal at a high logic level appear at double the intensity of a correct signal. Similarly, an error in the output signal at a low logic state provides an intensity of the light at a level which is below that of a correct value. By suitably manipulating this data in conventional electronic circuitry, indications of an error, the location of the error, and the state of the error can be made.

FIG. 6 is a pictorial illustration of the embodiment shown in block form in FIG. 5. According to FIG. 6, the light source 88' is a pulsed laser system which directs a light beam 96 onto the splitter 90'. Collimating lenses 98 and 100 direct the split light onto the spatial light modulators 80' and 84'. Although the light source is illustrated as a single laser source whose beam is split into two components, it is emphasized that two separate light sources, one for each spatial light modulator, may be used according to the teachings of the invention.

The output signal from the circuit under test is loaded into the spatial light modulator 80' which, in this embodiment, is a multi-channel acousto-optic cell. The complemented expected or correct output signal, which is derived from the reference signal generator 82 of FIG. 5, is loaded into the multi-channel acousto-optic cell 84' as shown in FIG. 6. When both modulators have been loaded with their respective data, the laser 88' is pulsed on to send the light beams through the spatial light modulators and through the lenses 102, 104, 106 and 108, and the filters 110 and 112. As discussed in connection with FIG. 2, the lenses and filters shown in FIG. 6 cooperate with the spatial light modulators to eliminate the non-modulated component of the light passing through the modulators and allowing only the spatially modulated light beams to be imaged upon the two dimensional detector array 92'.

A variation or modification to the apparatus shown in FIG. 6 is illustrated by the portion of the structure shown in FIG. 7. The spatial light modulator 84" shown in FIG. 7 is a magneto-optic cell which uses an analyzer 114 to filter out light from the magneto-optic cell 84" which does not have the appropriate polarization for the desired spatially modulated signal. This embodiment may be used in situations in which the speed of generation of the reference signal allows the use of a spatial light modulator having slower response than an acousto-optic cell. As shown in FIG. 7, the magneto-optic spatial light modulator 84" and the analyzer 114 are substituted for the components shown in FIG. 6 between the lens 100 and the detector array 92'.

FIG. 8 shows a timing diagram which illustrates the sequence of steps which may be used in operating the test system shown in Fig. 5 and 6. According to block 116, the data is loaded onto the two spatial light modulators and then the laser is pulsed on, as shown by block 118. The modulated light from the laser is then detected by the detector array and downloaded to the associated electronics of the system, as shown by block 120. The associated and conventional electronics analyzes, as shown by block 122, the data from the detector array according to conventional and usual methods for determining the presence and polarity of error segments in the composite detector signal. That is, the detection, location, and state of the error segments of waveform 70 shown in FIG. 4. Since the data downloaded from the detector array can be processed at a lower speed that the original output signal of the circuit under test, conventional and lower speed electronic circuitry may be used to make the determination and comparisons necessary for detecting any error segments in the detector array output.

As shown in FIG. 9, using a magneto-optic spatial light modulator in the reference portion of the light beam signal increases the amount of time required to load the spatial light modulator before the laser is pulsed on. As shown by blocks 124, 126, and 128 of FIG. 9, the two spatial light modulators are loaded with data and then the laser is pulsed on to provide the light which is imaged upon the detector array. After downloading, the data is analyzed as previously described, as shown by locks 130 and 132 in FIG. 9. Although loading of the spatial light modulators is shown as a sequential operation in FIG. 9, it is within the scope of the invention that these operations may be performed partially simultaneously in order to conserve time in loading the spatial light modulators. Additionally, the steps of downloading the detector and analyzing the data can be accomplished during a portion of the time in which new data is loaded onto one or both of the spatial light modulators.

The operation of the invention can be explained in mathematical terminology by representing the additive proces or algorithm by the summation of two logic values. For example, let $S_{Ei}$ describe the expected logic value for the ith output channel of the circuit under test. Similarly, let $S_{oi}$ describe the actual logic value of this same output channel. Both $S_{Ei}$ and $S_{oi}$ can have logic values of either zero or one. If both have the same value, then the ith state for a given channel is correct. If $S_{Ei} \neq S_{oi}$, the output is incorrect. By using these definitions, it is possible to form the additive algorithm in two steps.

STEP 1: Form the complement of $S_{Ei}$:

$$\overline{S}_{Ei} = 1 - S_{Ei}$$

STEP 2: Form the sum of $\overline{S}_{Ei}$ and $S_{oi}$:

Output = $OP = S_{oi} + 1 - S_{Ei}$
$OP = S_{oi} + \overline{S}_{Ei}$

The output, OP, resulting from step 2, contains all of the necessary test information as shown in Table 1.

TABLE 1

| Input Values | Sum Value ($S_{oi} + 1 - S_{Ei}$) | Test Result |
|---|---|---|
| $S_{Ei} = S_{oi} = 1$ | OP = 1, (1 + 1 − 1) | Correct |
| $S_{Ei} = S_{oi} = 0$ | OP = 1, (0 + 1 − 0) | Correct |
| $S_{Ei} = 1, S_{oi} = 0$ | OP = 0, (0 + 1 − 1) | False |
| $S_{Ei} = 0, S_{oi} = 1$ | OP = 2, (1 + 1 − 0) | False |

From Table 1, it can be seen that the output can have three values: 0, 1 and 2. When the output equals 1, the test indicates that no errors have occured. When OP=0 the output test indicates that a particular error has occured, that is, the ith channel of the circuit under test gave a logic 0 instead of a logic one. Similarly, when the output is equal to 2, it is known that the circuit under test gave an output 1 instead of an output 0. It is noted that similar information can be obtained if the squares of the sums of $S_{Ei}$ and $S_{oi}$ were formed. In such case, the output would have values 0, 1 and 4.

Acousto-optic (AO) cells have a center frequency $f_c$ and a bandwidth (BW) which define the operating parameters of the AO cell. In the case of a device under test which has 32 output channels, each of the outputs, $S_{oi}(t)$, i=1, 2, ..., 32, modulates the amplitude of the RF carriers driving the AO cell at frequency $f_c$. The result is a combination of 32 parallel signals driving the 32 channels of the AO cell.

The amplitude of the defracted light, which comes from the ith AO cell channel, can be described as:

$$A_i(t,y) = S_{oi}(t-y/v) \exp[j2\pi f_c(t-y/v)], \quad (1)$$

where y is the position of the AO cell measured from the transducer of the cell in the direction of sound propagation, and v is the speed of sound in the AO crystal. The image formed at the output plane, or the detector array, has 32 columns. The amplitude of the ith column is a function of both time and space and is given by equation (1).

The complement of the expected output vectors $\overline{S}_{Ei}$ (i=1, 2, ..., 32), are applied, according to this specific description, to a 32 channel magneto-optic device as shown by the modification shown in FIG. 7. The light leaving the ith channel of the magneto-optic (MO) device can be described as:

$$\overline{A}_i(y) = \overline{S}_{Ei}(y). \quad (2)$$

Thus, at the output plane of the detector array, another image of 32 columns is provided.

The overlapping of the light signals on the detector array is such that the ith column of the AO cell image coincides with the ith column of the a MO device image. The total intensity of the ith column of the output image is:

$$I_i(t,x_i,y) = |A_i(t,y) + \overline{A}_i(y)\exp[-j2\pi rx_i]|^2 = \quad (3)$$

$$|S_{oi}(t-y/v)|^2 + |\overline{S}_{Ei}(y)|^2 + 2S_{oi}(t-y/v)\overline{S}_{Ei}(y)\exp[-j2\pi rx_i],$$

where $x_i$ denotes the location in the x-direction of the center of the ith column, where x is an axis directed according to the x axis shown in FIG. 2. The phase factor esp $[-j2\pi rx_i]$ arises from the angular separation, $\theta$, of the signal and reference beams, where $r = \sin \theta / \lambda$ and $\lambda$ is the wavelength of the laser.

Assuming that the spacing of the 32 cell AO-MO device channels is uniform and such that the arguments $r_{xi}$ of the phase factor form an integer progression, then equation (3) can be written as:

$$I_i(t,y) = |S_{oi}(t-y/v)|^2 + |\overline{S}_{Ei}(y)|^2 + 2 K S_{oi}(t-y/v) \overline{S}_{Ei}(y), \quad (4)$$

where K is a constant whose range needs to be $0 \leq K \leq 1$. It is noted that in writing equation (4), it was assumed that the width of each image column is small compared to the wavelength of the spatial carrier (third term in equation (3)). This can be achieved by using narrow AO cell/MO device channels, small tilt, etc. The main feature is that the above requirements are such to obtain a constructive phase weighting that is the same for each of the 32 final image columns. Such a construction simplifies the required detector electronics considerably.

The pulse width of the laser $T_L$ and the pulse period T is such that $$T \geq NT_b = T_A, \quad (5)$$

where $T_b$ is the data bit period, $T_A$ is the AO cell time aperture, and $N = T_A/T_b$ is the number of bits or output states present in each of the 32 columns of the AO cell. N is also the number of expected output vectors present in each of the 32 channels of the MO device. The laser pulse width $T_L$ is kept such that $T_L < T_b$, so that while the laser pulse is "on" there is no significant motion of the data present in the AO cell. That is, the data is "frozen" every time a laser pulse occurs.

For a single laser shot, and since the data is "frozen" while the pulse is on, the information written on the jth detector pixel of the ith column can be described as:

$$I_i(y_j) = |S_{oi}(y_j)|^2 + |\overline{S}_{Ei}(y_j)|^2 + 2KS_{oi}(y_j)\overline{S}_{Ei}(y_j) = \quad (6)$$

$$I_{ij} = S_{oij}^2 + \overline{S}_{Eij}^2 + 2KS_{oij}\overline{S}_{Eij},$$

where $y_j$, j=1, 2, ..., N represents the spatial location of the jth detector pixel. Equation (6) takes its form because $T_L$ was assumed to be less than $T_b$, which allowed the elimination of the time dependence of equation (4). Equation (6) can be further simplified by dropping the squares. This is allowed since both $S_{oij}$ and $\overline{S}_{Eij}$ can take the values of zero or one. In this case, equation (6) can be written as:

$$I_{ij} = S_{oij} + \overline{S}_{Eij} + 2 K S_{oij}\overline{S}_{Eij}. \quad (7)$$

Equation (7) contains complete information about possible errors that occured in the jth state of the ith output channel. This can be seen by considering the case of K=0. In such case, $$I_{ij} = S_{oij} + \overline{S}_{Eij}. \quad (8)$$

As can be seen from equation (8), $I_{ij}$ is exactly the same as the desired test output OP described in Step 2. For the extreme case of K=1, the output has the form of:

$$I_{ij} = S_{oij} + \overline{S}_{Eij} + 2S_{oij}\overline{S}_{Eij}, \quad (9)$$

which is equivalent to forming the square of the output OP. For any other value of K, $0<K<1$, the three possible values of OP are: 0, 1, and $2+2K$.

The system described herein allows for the convenient and economical testing of very high speed digital logic circuits, including GaAs chips. It also provides for indication of the location and state of any errors which are detected, and provides this test information while the high speed device is operating at its normal clock frequencies. Single channel acousto-optic data recording has been demonstrated in actual test at clock frequencies up to approximately 300 megahertz, with this limit being set by the available electronic drive circuitry.

It is emphasized that numerous changes may be made in the above-described system without departing from the teachings of the invention. It is intended that all of the matter contained in the foregoing description, or shown in the accompanying drawings, shall be interpreted as illustrative rather than limiting.

I claim as my invention:

1. An optical system for testing high speed logic devices, said system comprising:
   means for driving the device under test with a set of input vectors;
   first means for producing a pulsed light signal;
   a first spatial light modulator;
   first means for loading a predetermined number of time sequenced binary values of an output signal from the device under test into said spatial light modulator;
   means for detecting the spatial light intensity of a modulated light signal produced when said pulsed light signal passes through said spatial light modulator;
   means for analyzing the detected light signal intensities; and
   means for synchronizing the operation of said driving, producing, detecting, and analyzing means, said synchronizing causing the light signal to be pulsed on after said predetermined number of binary values of the input vector driven output signals have been loaded into the spatial light modulator.

2. The optical system of claim 1 wherein the means for analyzing the detected light signal intensities compares the binary equivalent of the detected light values with stored binary values of the expected logic state, and wherein the presence of signal intensities not equal to the stored values are identified.

3. The optical system of claim 1 wherein additional sets of input vectors drive the device under test, with all of the sets providing enough output signals to determine the overall condition of the device under test.

4. The optical system of claim 1 including:
   means for directing the pulsed light through the spatial light modulator and onto the directing means; and
   means for filtering unwanted modulation sidebands from the modulated light.

5. The optical system of claim 1 wherein the first spatial light modulator is an acousto-optic cell.

6. The optical system of claim 1 wherein the detecting means is an optical-to-electrical converter having at least as many separate pixel areas as the predetermined number of binary values loaded into the first spatial light modulator.

7. The optical system of claim 1 including:
   a second spatial light modulator;
   second means for loading a reference signal into said second spatial light modulator, said reference signal being the complement of the expected output signal from the device under test;
   second means for producing a pulsed light signal upon said second spatial light modulator; and
   means for directing the modulated light from the second spatial light modulator onto said detecting means.

8. The optical system of claim 7 wherein the first and second means for producing pulsed light signals utilize a common laser light signal 9. The optical system of claim 7 wherein the detected spatial light intensity is equal to the optical sum of the light from the output signal and the light of the corresponding binary value from the complemented reference signal.

10. The optical system of claim 9 wherein the analyzing means includes means for determining when the detected light signal intensities are of first, second, or third values, with the first value corresponding to a detected error of one binary state, the second value corresponding to a non-error condition, and the third value corresponding to a detected error of the other binary state.

11. The optical system of claim 10 wherein said second signal intensity value is less than said third value and is greater than said first value.

12. The optical system of claim 7 wherein the second spatial light modulator is an acousto-optic cell.

13. The optical system of claim 7 wherein the second spatial light modulator is a magneto-optic cell.

14. The optical system of claim 7 wherein the reference signal is derived from a standard of the device under test.

15. The optical system of claim 7 wherein the reference signal is derived from standard values stored in a memory array.

16. A method for optically testing high-speed logic devices, said method including the steps of:
   applying a predetermined input signal to the input of the device under test;
   loading a predetermined number of time-sequenced binary states of an output signal of the device under test into a first spatial light modulator;
   pulsing on a light source after the predetermined number of binary states have been loaded into the modulator;
   directing the pulsed light onto the modulator and, after modulation, onto a detector array;
   detecting the spatial light intensities of the modulated light pulse; and
   analyzing the detected spatial light intensities to determine if an error exists in the output signal.

17. The method of claim 16 wherein the analyzing step includes the steps of:
   converting the spatial light intensities into binary logic values; and comparing the converted values to stored logic values representative of a correct output signal.

18. The method of claim 16 including the steps of:
loading a reference signal into a second spatial light modulator, said reference signal being the complement of a correct output signal;
pulsing a light signal through said second light modulator;
combining the detected spatial intensities for each respective binary location of the output and reference signals; and
determining the location and magnitude of any binary location which has a magnitude different from a value equal to the magnitude of a binary location representing a single high logic state.

19. The method of claim 18 including the step of indicating the correct logic of any errors determined by the testing method.

20. The method of claim 18 wherein an error indicating that a correct high logic state is not present is determined by observing a combined magnitude equal to twice the magnitude of a single high logic state.

* * * * *